United States Patent
Matsumura

(10) Patent No.: US 10,882,141 B2
(45) Date of Patent: Jan. 5, 2021

(54) SUBSTRATE SUCTION STAGE, SUBSTRATE TREATMENT APPARATUS, AND SUBSTRATE TREATMENT METHOD

(71) Applicant: Mitsubishi Electric Corporation, Tokyo (JP)

(72) Inventor: Tamio Matsumura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/770,236

(22) PCT Filed: Mar. 10, 2016

(86) PCT No.: PCT/JP2016/057627
§ 371 (c)(1),
(2) Date: Apr. 23, 2018

(87) PCT Pub. No.: WO2017/154173
PCT Pub. Date: Sep. 14, 2017

(65) Prior Publication Data
US 2018/0304408 A1 Oct. 25, 2018

(51) Int. Cl.
*B23K 26/38* (2014.01)
*H01L 21/687* (2006.01)
(Continued)

(52) U.S. Cl.
CPC ............ *B23K 26/38* (2013.01); *B23K 26/142* (2015.10); *H01L 21/67051* (2013.01);
(Continued)

(58) Field of Classification Search
CPC ......... H01L 21/67051; H01L 21/67092; H01L 21/6883; H01L 21/68792; B23K 26/142
See application file for complete search history.

(56) References Cited

U.S. PATENT DOCUMENTS 4,391,511 A * 7/1983 Akiyama ................. G03F 7/24
269/21
4,738,748 A * 4/1988 Kisa ..................... H01L 21/3065
156/345.27
(Continued)

FOREIGN PATENT DOCUMENTS

JP 11-87477 A * 11/1997
JP 2014-086638 A 5/2014

OTHER PUBLICATIONS

Notification of Transmittal of Translation of the International Preliminary Report on Patentability and Translation of Written Opinion of the International Searching Authority; PCT/JP2016/057627; dated Sep. 20, 2018.
(Continued)

*Primary Examiner* — Dale E Page
*Assistant Examiner* — Quovaunda Jefferson
(74) *Attorney, Agent, or Firm* — Studebaker & Brackett PC

(57) ABSTRACT

A substrate suction stage including a substrate support unit having a top surface, a cavity formed therein, an ejection hole formed therein and extending from the cavity to the top surface, and a suction hole formed therein for connecting the ejection hole and the top surface, and a gas supply unit for supplying gas into the cavity, wherein the ejection hole surrounds the suction hole in plan view, and when gas is supplied into the cavity, gas in the suction hole is discharged to the outside via the ejection hole.

16 Claims, 9 Drawing Sheets

(51) Int. Cl.
    *H01L 21/67*     (2006.01)
    *B23K 26/142*     (2014.01)
    *H01L 21/683*     (2006.01)
    *B23K 101/18*     (2006.01)

(52) U.S. Cl.
    CPC .... *H01L 21/67092* (2013.01); *H01L 21/6838* (2013.01); *H01L 21/68792* (2013.01); *B23K 2101/18* (2018.08)

(56) References Cited

U.S. PATENT DOCUMENTS

| | | | | |
|---|---|---|---|---|
| 4,949,783 | A * | 8/1990 | Lakios | H01L 21/67109 165/80.1 |
| 5,171,398 | A * | 12/1992 | Miyamoto | B32B 37/10 156/552 |
| 7,601,224 | B2 * | 10/2009 | Foree | C23C 16/45521 118/724 |
| 2004/0211762 | A1 * | 10/2004 | Sekiya | B23K 26/0853 219/121.82 |
| 2005/0193952 | A1 * | 9/2005 | Goodman | H01L 21/67028 118/728 |
| 2009/0280248 | A1 * | 11/2009 | Goodman | C23C 16/4581 427/255.28 |
| 2014/0116478 | A1 | 5/2014 | Higashijima et al. | |

OTHER PUBLICATIONS

International Search Report issued in PCT/JP2016/057627; dated May 24, 2016.
Written Opinion issued in PCT/JP2016/057627; dated May 24, 2016.
Notification of Transmittal of the International Search Report and the Written Opinion of the International Searching Authority, or the Declaration issued in PCT/JP2016/057627; dated May 24, 2016.

* cited by examiner

SUBSTRATE SUCTION STAGE, SUBSTRATE TREATMENT APPARATUS, AND SUBSTRATE TREATMENT METHOD

FIELD

The present invention relates to a substrate suction stage, a substrate treatment apparatus and a substrate treatment method that are used when a substrate is subjected to a liquid treatment.

BACKGROUND

For example, in a wafer process for a power device or the like, in some cases, after a transistor is formed on the surface of an FZ wafer, the back surface of the wafer is ground, and ion implantation is performed on the ground back surface or a metal electrode film is formed on the ground back surface. When the thickness of a wafer is reduced to, for example, 100 μm or less as a result of the grinding of the wafer, the wafer warps by several millimeters, which makes it impossible to carry the wafer in an ion implantation apparatus or the like.

There is known a method of hollowing out only the inside of a wafer while the peripheral side of the wafer is left by several millimeters in order to suppress a warp of the wafer. The portion which is left thick on the peripheral side is called as a ring portion. It is necessary to finally cut out the ring portion from the wafer. A method using a water-column laser to cut out the ring portion is known. The water-column laser is a YAG laser beam introduced into a high-pressure water column having a diameter of several tens μm. Water used for the water-column laser is contaminated with ground scraps. When the ground scraps adhere to a wafer, it causes foreign matters or stain, resulting in a decrease of the yield of non-defective products. Furthermore, when such water enters the space between a stage and the back surface of a wafer, it hinders the wafer from separating from the stage, and the wafer may crack.

Patent Literature 1 discloses a substrate suction stage for sucking a substrate under vacuum.

PRIOR ART

Patent Literature

Patent Literature 1: JP2014-086638A

SUMMARY

Technical Problem

When a substrate is subjected to a liquid treatment, liquid should be prevented from entering the back surface side of the substrate. Therefore, it may be considered that the substrate is spun at the rotation number of 600 revolutions/min or more to scatter liquid outwards by centrifugal force. However, since the scan speed of the water-column laser is equal to several hundreds mm/sec or less, in the case of the wafer diameter of 200 mm, it is converted to the rotation number of about several tens revolutions/min. Accordingly, it is impossible to spin the substrate at a high speed in the liquid treatment using the water-column laser. A technique capable of performing the liquid treatment while preventing liquid from entering the back surface side of the substrate has been required without being limited to the case of using the water-column laser.

The present invention has been made to solve the foregoing problem, and has an object to provide a substrate suction stage, a substrate treatment apparatus and a substrate treatment method that can perform a liquid treatment while preventing liquid from entering the back surface side of a substrate.

Means for Solving the Problems

According to a present invention, a substrate suction stage includes a substrate support unit having a top surface, a cavity formed therein, an ejection hole formed therein and extending from the cavity to the top surface, and a suction hole formed therein for connecting the ejection hole and the top surface, and a gas supply unit for supplying gas into the cavity, wherein the ejection hole surrounds the suction hole in plan view, and when gas is supplied into the cavity, gas in the suction hole is discharged to the outside via the ejection hole.

According to a present invention, a substrate treatment apparatus includes a substrate suction stage including a substrate support unit having a top surface, a cavity formed therein, an ejection hole formed therein and extending from the cavity to the top surface, and a suction hole formed therein for connecting the ejection hole and the top surface, and a gas supply unit for supplying gas into the cavity, wherein the ejection hole surrounds the suction hole in plan view, and when gas is supplied into the cavity, gas in the suction hole is discharged to the outside via the ejection hole, and a liquid treatment apparatus for performing a liquid treatment on a substrate on the substrate suction stage.

According to a present invention, a substrate treatment method includes the steps of placing a substrate on a top surface of a substrate support unit, and performing a liquid treatment on the substrate while, by supplying gas from one gas supply unit into a cavity inside the substrate support unit, the gas is sprayed from an ejection hole intercommunicating with the cavity to a peripheral portion of a back surface of the substrate, and gas is discharged from a suction hole for connecting the top surface of the substrate support unit and the ejection hole, thereby causing the substrate to be sucked on the substrate support unit.

Other features of the present invention will become apparent from the following description.

Advantageous Effects of Invention

According to the present invention, since a single gas supply unit enables a substrate to be sucked onto a substrate support unit under vacuum and also enables gas to be sprayed to the peripheral portion of the back surface of the substrate, a liquid treatment can be performed while preventing liquid from entering the back surface side of the substrate.

BRIEF DESCRIPTION OF THE DRAWINGS

FIG. 15 is a plan view of the second part and the like.

DESCRIPTION OF EMBODIMENTS

A substrate suction stage, a substrate treatment apparatus and a substrate treatment method according to embodiments of the present invention will be described with reference to the drawings. The same or corresponding constituent elements are represented by the same signs, and duplicative descriptions thereof may be omitted.

First Embodiment

Figure 1:
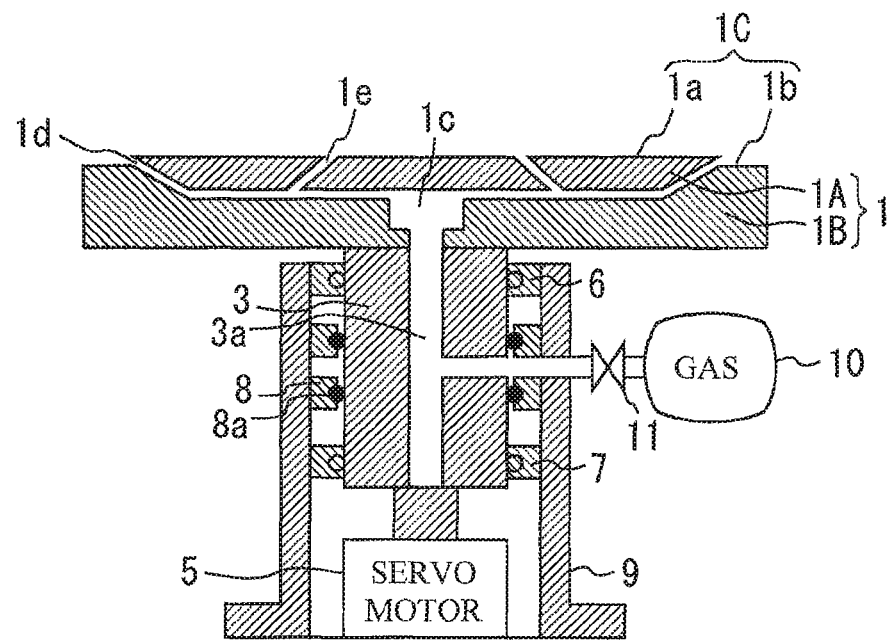
FIG. 1 is a cross-sectional view of a substrate suction stage according to a first embodiment.

FIG. 1 is a cross-sectional view of a substrate suction stage according to a first embodiment. The substrate suction stage includes a substrate support unit 1 for supporting a substrate. The substrate support unit 1 has a top surface 1C. The top surface IC has a first top surface 1a, and a second top surface 1b formed to be lower than the first top surface 1a. A cavity 1c is formed inside the substrate support unit 1. The cavity 1c is located substantially at the center of the substrate support unit 1.

In the substrate support unit 1 are formed an ejection hole 1d extending from the cavity 1c to the top surface 1C, and suction holes 1e for connecting the ejection hole 1d and the top surface 1C. The ejection hole 1d intercommunicates with the cavity 1c, and extends to a step portion between the first top surface 1a and the second top surface 1b. The suction holes 1e are formed in the first top surface 1a. The suction holes 1e provide channels for connecting the top surface 1C of the substrate support unit 1 and the ejection hole 1d. The suction holes 1e are formed to be inclined in cross-sectional view.

The substrate support unit 1 includes a first part 1A and a second part 1B. The first part 1A is a portion in which the first top surface 1a and the suction holes 1c are formed. The second part 1B is a portion having the second top surface 1b. Most of the second part 1B is located below the first part 1A. The shape of the ejection hole 1d is determined by the lower surface of the first part 1A and the upper surface of the second part 1B.

Figure 2:
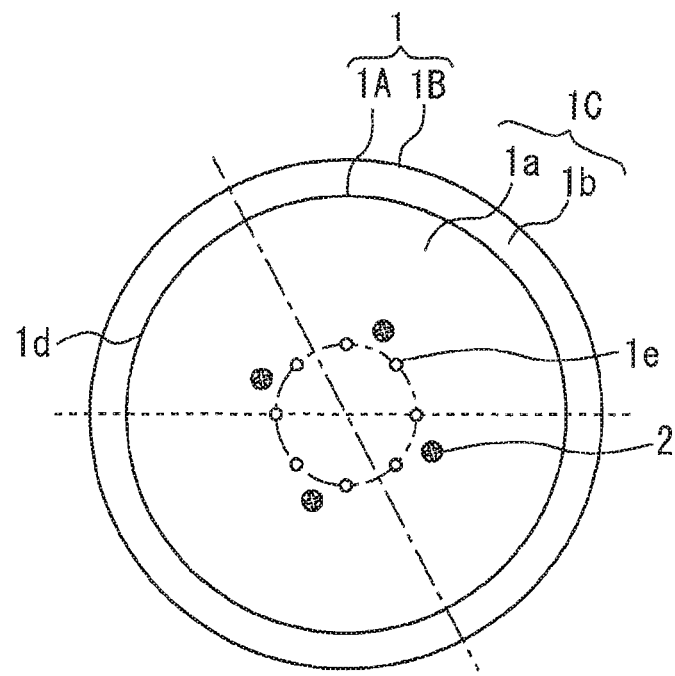
FIG. 2 is a plan View of the substrate support unit.

FIG. 2 is a plan view of the substrate support unit 1. The second top surface 1b surrounds the first top surface 1a. A plurality of suction holes 1e are formed at the center portion of the substrate support unit 1. The ejection hole 1d is formed in an annular shape at the boundary between the first top surface 1a and the second top surface 1b. The ejection hole 1d surrounds the suction holes 1e in plan view. The first part 1A is fixed to the second part 1B by screws 2.

Figure 3:
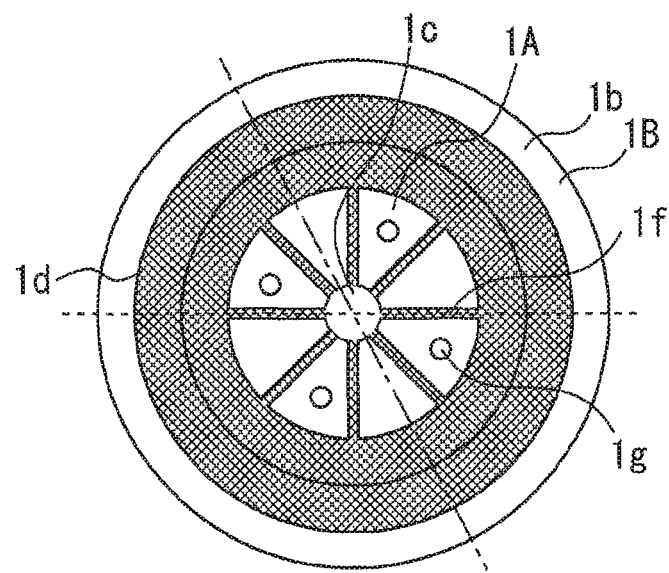
FIG. 3 is a plan view showing a part of the substrate support unit.

FIG. 3 is a plan view showing a part of the first part 1A and the second part 1B. The bottom surface of the ejection hole 1d is formed by the second part 1B. A hatched area in FIG. 3 represents a channel of the ejection hole 1d. This channel is defined by eight grooves if extending in a direction away from the cavity 1c and an annular area intercommunicating with the grooves 1f. A part of the first part 1A is in contact with the second part 1B, thereby forming the grooves 1f each having a small width.

Screw holes 1g are formed in the first part 1A and the second part 1B. The screws 2 described above are fixed to the screw holes 1g. The substrate unit 1 of FIG. 1 corresponds to a cross-sectional view along a broken line of FIG. 2. The broken lines of FIGS. 2 and 3 represent the same position. These broken lines are lines passing through portions containing the grooves 1f.

Figure 4:
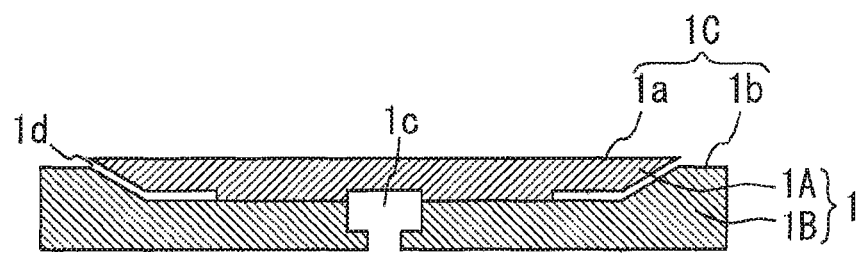
FIG. 4 is a cross-sectional view of the substrate support unit.

FIG. 4 is a cross-sectional view along a one-dotted chain line of FIG. 2. The one-dotted chain line is a line passing through a portion having no groove 1f. In the portion having no groove 1f formed therein, since the first part 1A shown in FIG. 3 blocks the space between the cavity 1c and the ejection hole 1d, the cavity 1c and the ejection hole 1d do not intercommunicate with each other. One-dotted chain lines of FIGS. 2 and 3 represent the same position.

Returning to the description of FIG. 1, a stage rotating shaft 3 is provided below the substrate support unit 1. The stage rotating shaft 3 is a portion rotated by a servo motor 5. The stage rotating shaft 3 has a hollow 3a therein. The hollow 3a intercommunicates with the cavity 2c of the substrate support unit 1. The stage rotating shaft 3 is surrounded by a fixed barrel 9. The fixed barrel 9 includes an upper shaft bearing 6, a lower shaft bearing 7 and a rotation seal 8. The upper shaft bearing 6 and the lower shaft bearing 7 support the stage rotating shaft 3 configured to rotate. The rotation seal 8 is in contact with the stage rotating shaft 3 via an O ring 8a.

The hollow 3a is connected to a gas supply unit 10 via holes formed in the side surfaces of the stage rotating shaft 3 and the fixed barrel 9 and a valve 11. The gas supply unit 10 serves to pressurize gas such as inert gas and supply the pressurized gas into the hollow 3a and the cavity 1e, for example.

Figure 5:
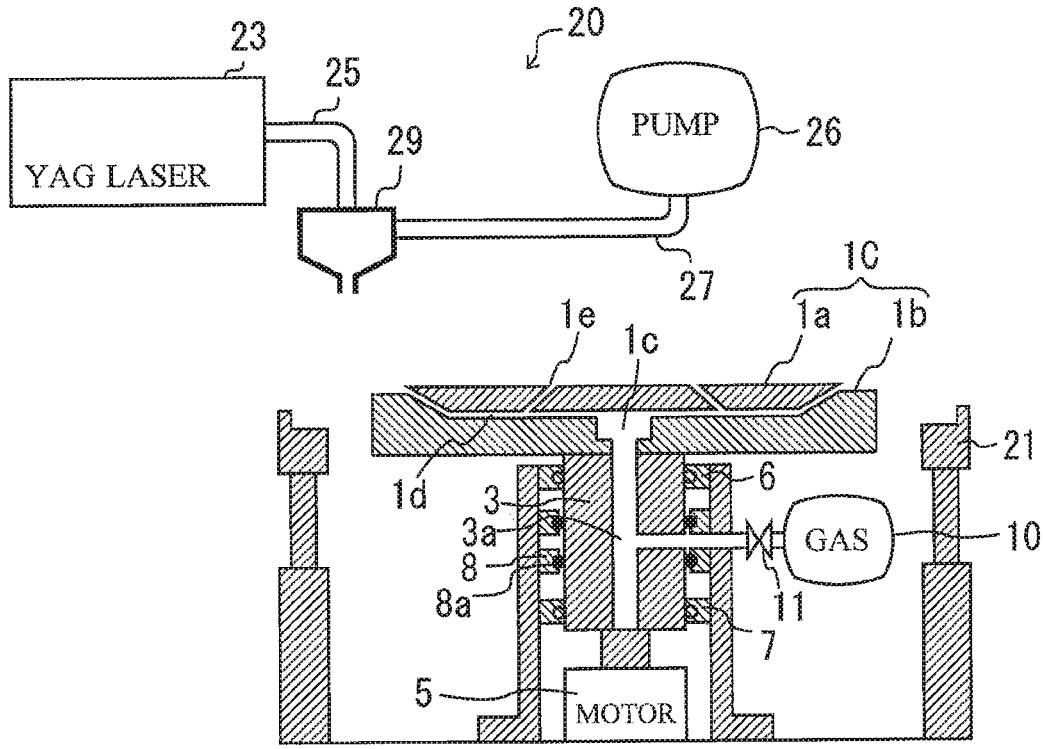
FIG. 5 is a view of a substrate treatment apparatus.

FIG. 5 is a cross-sectional view of a substrate treatment apparatus having the substrate suction stage described above. The substrate treatment apparatus includes a liquid treatment apparatus 20 for subjecting the substrate on the substrate suction stage to a liquid treatment. The liquid treatment apparatus 20 includes a liquid supply unit 26 for supplying liquid to the substrate, and a laser unit 23 which is a YAG laser oscillator for supplying a laser beam into the liquid. The laser beam passes through an optical fiber 25, and reaches a water-column mixing nozzle 29 while the liquid passes through a high-pressure pipe 27 and reaches the water-column mixing nozzle 29.

In consideration of a case where a hollowed-out wafer having a thick ring portion at the peripheral portion of the wafer is subjected to a liquid treatment, a ring portion receiver 21 for receiving the ring portion is provided. The upper surface of the ring portion receiver 21 is located at a position lower than the top surface 1C of the substrate support unit 1.

Figure 6:
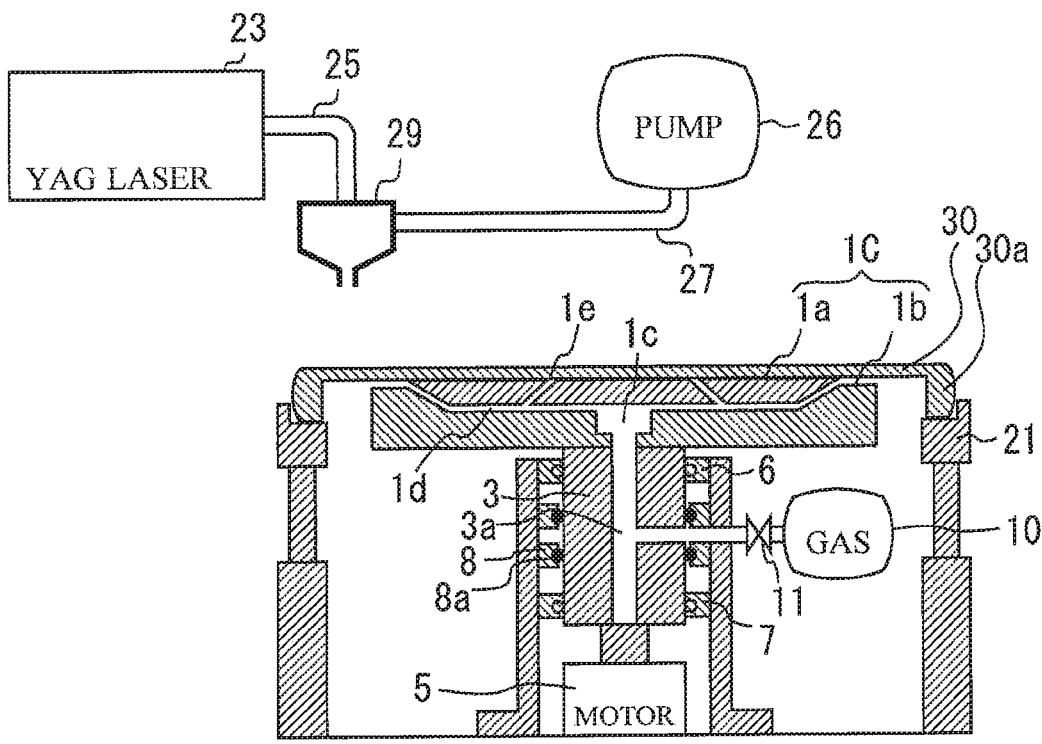
FIG. 6 is a diagram showing that the substrate is placed on the substrate treatment apparatus.

Next, a substrate treatment method using the substrate treatment apparatus shown in FIG. 5 will be described. First, a substrate is placed on the first top surface 1a of the substrate support unit 1. FIG. 6 is a diagram showing that the substrate 30 is placed on the first top surface 1a of the substrate support unit 1. The substrate 30 is a hollowed-out wafer obtained by hollowing out the inside of the center portion of a water so that the center portion thereof is thin and the peripheral portion thereof is thick. The thick portion of the peripheral portion is a ring portion 30a. The thin center portion is placed on the first top surface 1a, and the ring portion 30a is placed on the ring portion receiver 21.

Figure 7:
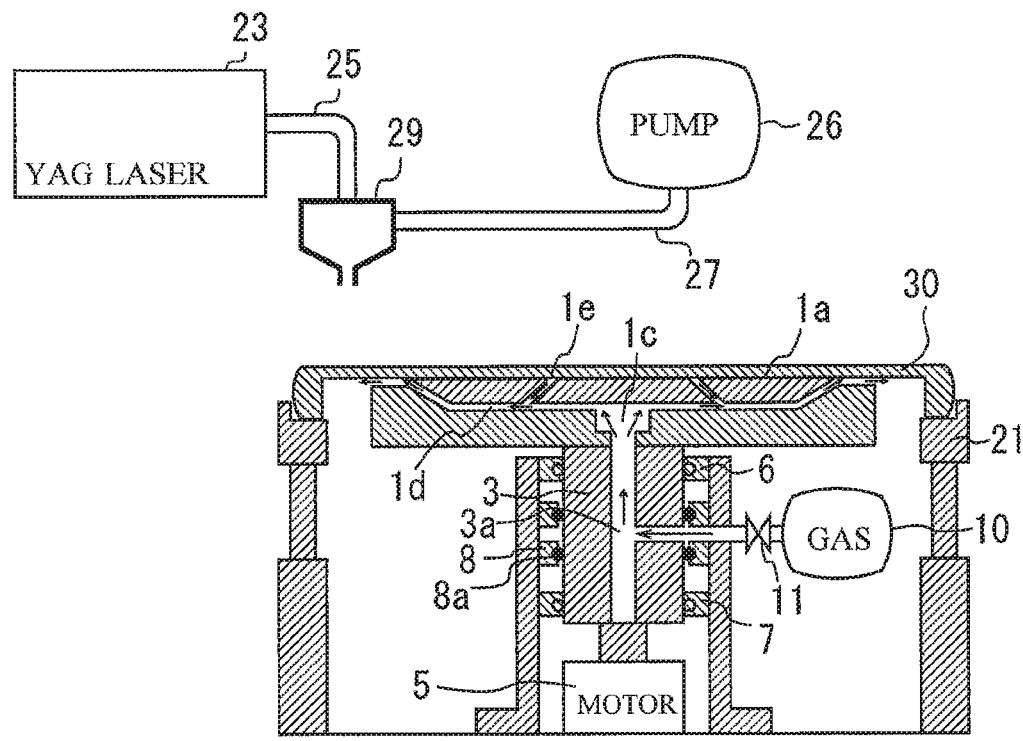
FIG. 7 is a diagram showing that the substrate is sucked to the substrate suction stage.

Next, the valve 11 is opened, FIG. 7 is a diagram showing that a flow of gas occurring by opening the valve 11 is represented by arrows. When the valve 11 is opened, pressurized gas is supplied from the gas supply unit 10 into the hollow 3a in the stage rotating shaft 3 and the cavity 1c of the substrate support unit 1. Furthermore, a flow of gas passing through the grooves 1f of FIG. 3 which are a part of the ejection hole 1d is generated. The cross-sectional area narrows from the cavity 1e to the grooves 1f, so that the flow velocity increases and thus a Venturi effect occurs. As a result, vacuum occurs in the suction holes 1e, so that the substrate 30 is sucked onto the first top surface 1a. In other words, when pressurized gas is supplied into the cavity 1e, gas in the suction holes 1e is discharged to the outside through the ejection hole 1d. The pressurized gas passing through the ejection hole 1d is discharged to the peripheral portion of the back surface of the substrate 30.

Figure 8:
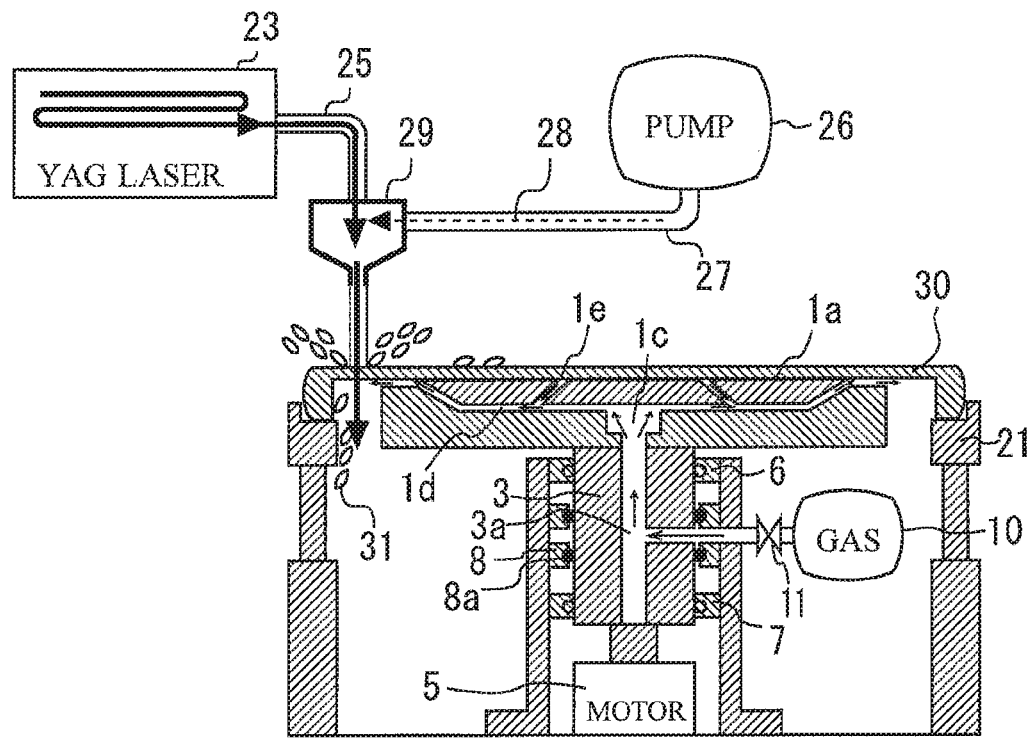
FIG. 8 is a diagram showing the cutting of the substrate.

As described above, the substrate 30 is sucked on the first top surface 1a, and the substrate 30 is cut out while maintaining a state where gas is sprayed to the peripheral portion of the hack surface of the substrate 30. FIG. 8 is a diagram showing the cutting of the substrate. High-pressure water 28 is supplied from the liquid supply unit 26 to the water-column mixing nozzle 29. Furthermore, a laser beam is supplied from the laser unit 23 through the optical fiber 25 to the water-column mixing nozzle 29. The substrate 30 is cut out by the laser beam entering a water column having a diameter of several tens μm while the water column is sprayed onto the upper surface of the substrate 30 from the water-column mixing nozzle 29.

At this time, since gas is radially sprayed from the ejection hole 1d to the peripheral portion of the back surface of the substrate 30, water 31 containing laser scraps can be prevented from intruding to the back surface of the substrate 30. In order to advance the cutting of the substrate 30, the substrate support unit 1, the servo motor 5 and the ring portion receiver 21 are rotated integrally with one another by an X-Y stage, for example. The feeding speed of the substrate 30 is set to, for example several hundreds mm/sec or less. By causing the substrate 30 to make one revolution as described above, the ring portion 30a is cut out from the substrate 30.

Figure 9:
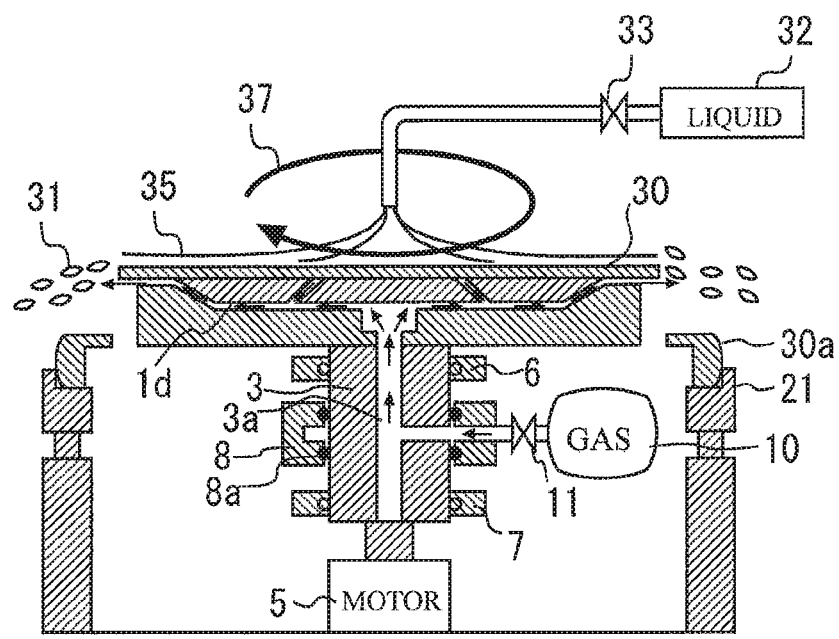
FIG. 9 is a diagram showing a cleaning sequence of the substrate.

FIG. 9 is a diagram showing an operation after the cutting of the ring portion. When the cutting of the ring portion 30a is finished, the ring portion receiver 21 is moved downwards. Then, a cleaning sequence is started. As shown in FIG. 9, the cleaning sequence is performed while the pressurized gas is supplied from the gas supply unit 10 into the hollow 3a and the cavity 1e. Under this state, the water 31 which adheres to the surface of the substrate 30 and contains laser scraps is washed out by liquid. Specifically, cleaning solution 35 is supplied from a cleaning solution supply unit 32 onto the upper surface of the substrate 30, and the substrate support unit 1 is spun at the rotation number of 500 revolutions/min or more by the servo motor 5, which makes it possible to scatter the water 31 on the substrate 30 by centrifugal force. A valve 33 is closed at a proper timing, and all the cleaning solution 35 is scattered by centrifugal force. The spin direction of the substrate support unit 1 is represented by an arrow 37.

Since the hollow 3a of the stage rotating shaft 3 is sealed by the rotation seal 8 and the O ring 8a, the pressurized gas can be supplied from the gas supply unit 10 into the cavity 1c during rotation of the stage rotating shaft 3. Therefore, centrifugal force can be applied to the substrate 30 while spraying gas to the peripheral portion of the back surface of the substrate 30, so that the water 31 can be prevented from intruding to the back surface side of the substrate 30.

As described above, only a pressurized gas flow for one system which is generated from one gas supply unit 10 makes it possible to generate vacuum for suction of a substrate and spray gas to the peripheral portion of the back surface of the substrate. Accordingly, gas flows for two systems for generation of vacuum and spray of gas are unnecessary. In the liquid treatment, liquid is supplied to the upper surface of the substrate 30 while spraying gas to the peripheral portion of the back surface of the substrate 30, so that the liquid can be prevented from going round to the back surface side of the substrate. Accordingly, wetting of the back surface of the substrate 30, staining of the back surface of the substrate 30 due to wetting, and wetting of the top surface 1C of the substrate support unit 1 can be prevented.

According to the first embodiment of the present invention, it is unnecessary to rotate the substrate at high speed in order to prevent the liquid from going round to the back surface of the substrate. Therefore, the liquid treatment can be performed on the upper surface of the substrate while the substrate support unit 1 is stopped or rotated at a low speed. In the first embodiment, the water-column laser cutting processing is adopted as the liquid treatment. When the substrate suction stage of the first embodiment is adopted, the substrate treatment apparatus can be prevented from having a complicated configuration by providing the ring portion receiver 21 separately from the substrate suction stage shown in FIG. 1.

An important point of the invention according to the first embodiment resides in that the liquid treatment is performed on the substrate 30 while, by supplying gas from one gas supply unit 10 into the cavity 1c inside the substrate suction stage, the gas is sprayed from the ejection hole 1d to the peripheral portion of the back surface of the substrate 30, and gas is discharged from the suction holes 1e to cause the substrate 30 to be sucked on the substrate suction stage. Various modifications may be performed on the substrate suction stage, the substrate treatment apparatus and the substrate treatment method described above insofar as the foregoing features is not lost. For example, the liquid treatment for cutting a substrate with a laser beam while applying water to the front surface of the substrate is described in the first embodiment. However, another treatment may be performed insofar as it is a treatment using liquid. A substrate other than a hollowed-out wafer may be used as a treatment target. An element for rotating the substrate support unit may be omitted according to the content of the liquid treatment.

These modifications may be appropriately applied to a substrate suction stage, a substrate treatment apparatus and a substrate treatment method according to the following embodiments. Furthermore, the substrate suction stage, the substrate treatment apparatus and the substrate treatment method according to the following embodiments will be described while concentrating on the differences from the first embodiment because there are lots of common points to the first embodiment.

Second Embodiment

Figure 10:
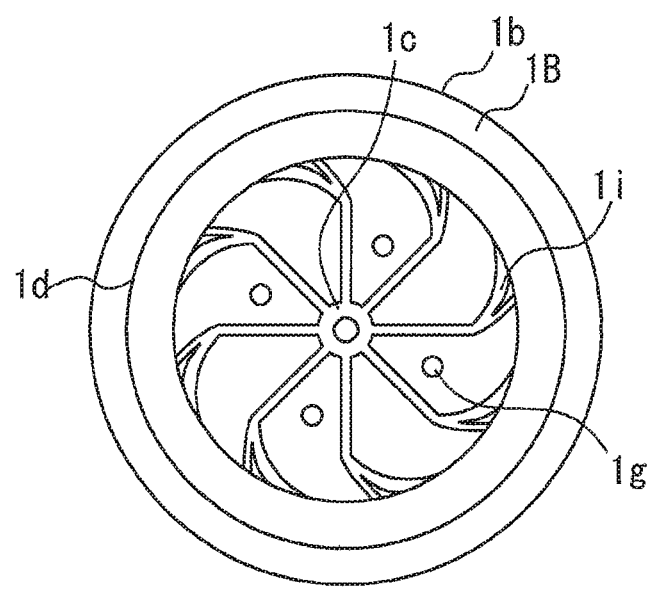
FIG. 10 is a plan view showing a part of the substrate support unit according to a second embodiment.

FIG. 10 is a plan view showing a second part 1B according to a second embodiment. The second part 1B of the substrate support unit 1 is formed in a circular shape in plan view. In the second part 1B of FIG. 10, the shape of grooves 1*i* is different from that of the grooves 1*f* of FIG. 3. The grooves 1*i* are formed to be straight in an area near to the cavity 1*c*, but to be curved in an area far from the cavity 1*c*. These curved portions can provide a gas flow ejected from the ejection hole 1*d* with a component traveling in a tangent direction of the outer edge of the second part 1B.

Figure 11:
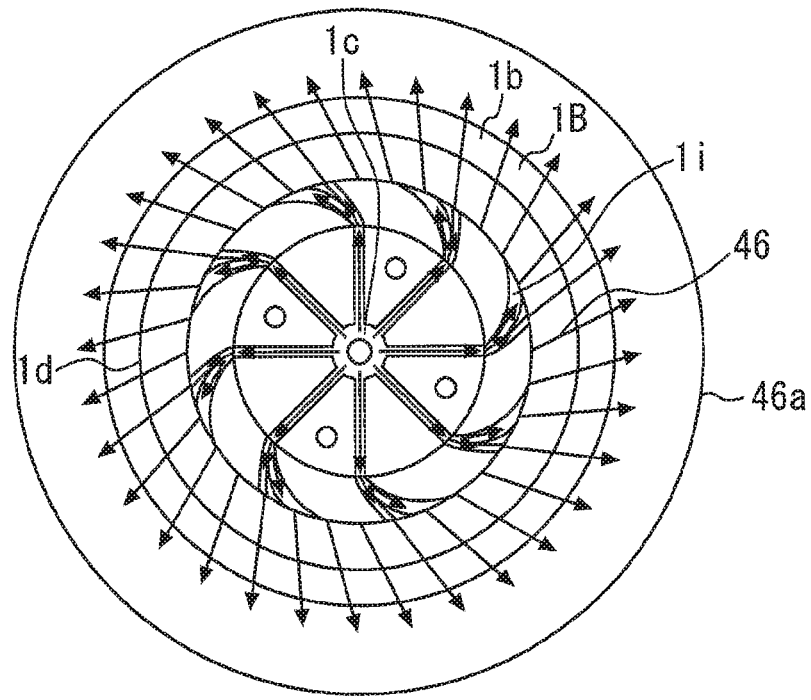
FIG. 11 is a diagram showing the gas flow.

FIG. 11 is a diagram showing that gas flows inside and outside the ejection hole 1*d* when pressurized gas is supplied into the cavity 1*c* are represented by arrows. The direction of an arrow 46 represents the travel direction of the gas ejected from the ejection hole 1*d*, and the length of the arrow 46 represents the speed of the gas. A curved line 46*a* represents the speed of the gas ejected from the ejection hole 1*d*. The distance from the ejection hole 1*d* to the curved line 46*a* represents the speed of gas at that position. The distance from the ejection hole 1*d* to the curved line 46*a* is substantially uniform at any place, and thus it is apparent that the gas can be sprayed to the peripheral portion of the back surface of the substrate at a substantially equal flow rate.

Figure 12:
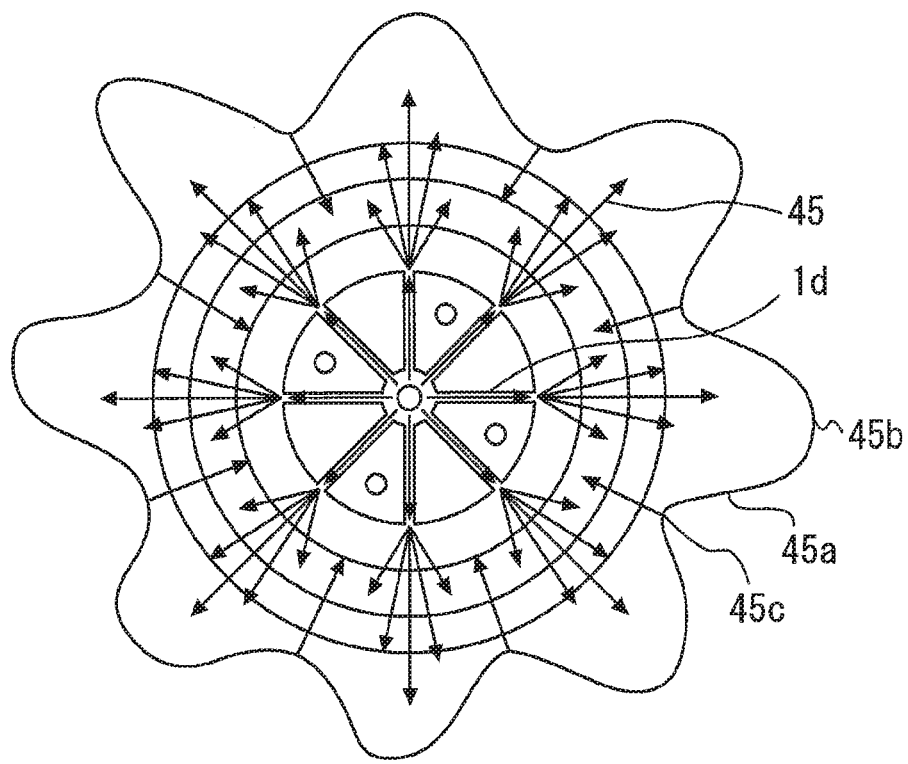
FIG. 12 is a diagram showing that the travel direction of the gas according to the first embodiment.

On the other hand, with respect to the shape of the grooves of the second part 18 of the first embodiment, it is impossible to eject the gas in a radial direction substantially uniformly. FIG. 12 is a diagram showing that the travel direction of the gas when the shape of the grooves according to the first embodiment is adopted is represented by arrows. The direction of an arrow 45 represents the travel direction of the gas ejected from the ejection hole 1*d*, and the length of the arrow 45 represents the speed of the ejected gas. A curved line 45*a* represents the speed of the gas ejected from the ejection hole 1*d*. As is apparent from the curved line 45*a*, the gas speed is uneven with respect to the flow direction of the gas. A flow of gas directing to the cavity 1*c* may occur at a place 45*c* sandwiched between places 45*b* where an ejected gas flow is strong. When the speed of the gas ejected from the ejection hole 1*d* is uneven as described above, there is a risk that the liquid goes round to a specific place on the back surface of the substrate.

However, as described with reference to FIG. 11, gas having a substantially uniform flow rate can be sprayed to the whole peripheral portion of the back surface of the substrate by providing the curved grooves 1*f*. As a result, the effect of preventing the intrusion of the liquid to the peripheral portion of the back surface of the substrate can be enhanced.

The shape of the grooves if according to the second embodiment may be appropriately modified. The ejection hole 1*d* may be configured to have any shape insofar as it is formed to eject gas at an angle less than 90° with respect to the tangent of the outer edge of the substrate support unit 1.

Third Embodiment

Figure 13:
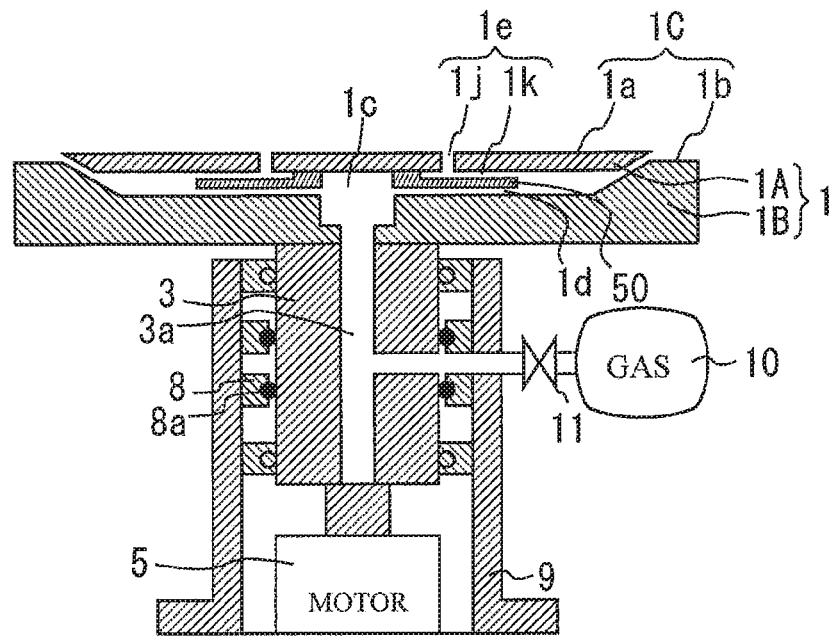
FIG. 13 is a cross-sectional view showing a substrate suction stage according to a third embodiment.

FIG. 13 is a cross-sectional view showing a substrate suction stage according to a third embodiment. The first part 1A of the substrate support unit 1 includes partition plates 50. A part of the ejection hole 1*d* is located below the partition plate 50, and the suction holes 1*e* are located above the partition plate 50. The suction hole 1*e* comprises a parallel channel 1*k* that intercommunicates with the ejection hole 1*d* and extends in parallel to the ejection hole 1*d*, and a connection channel 1*j* for connecting the parallel channel 1*k* and the top surface 1C of the substrate support unit 1. The parallel channel 1*k* includes an area on the cavity is side, and an area on the outer edge side of the substrate support unit 1. The area on the outer edge side intercommunicates with the ejection hole 1*d*, and the area on the cavity 1*c* side intercommunicates with the connection channel 1*j*.

Figure 14:
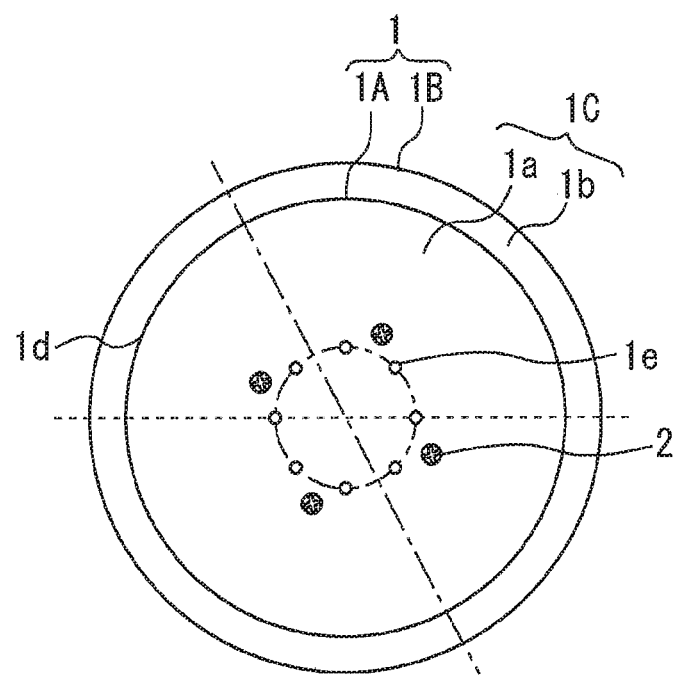
FIG. 14 is a plan view showing the substrate support unit.
Figure 15:
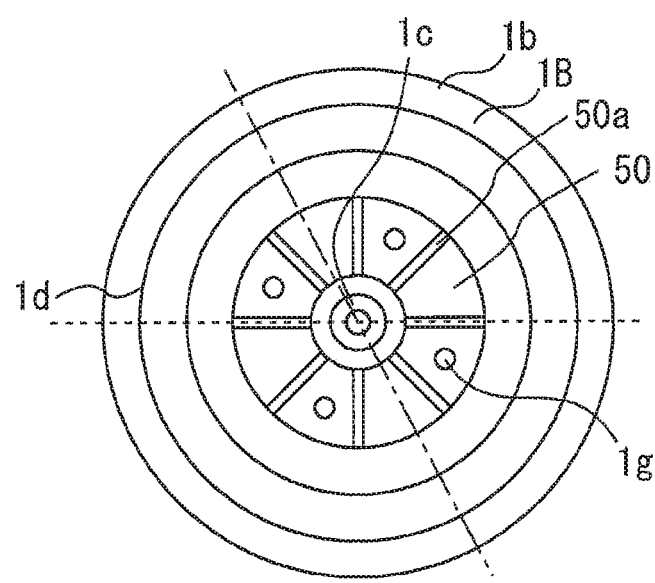
Figure 16:
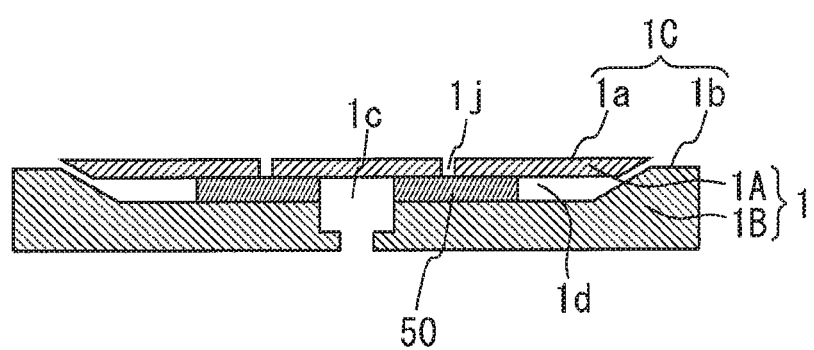
FIG. 16 is a cross-sectional view of the substrate support unit.

FIG. 14 is a plan view showing the substrate suction stage according to the third embodiment. The cross-sectional view along a broken line of FIG. 14 is FIG. 13. FIG. 15 is a plan view of the second part 1B and the partition plates 50 according to the third embodiment. Grooves 50*a* are formed by the partition plates 50, and the grooves 50*a* serve as a part of the ejection hole 1*d*. FIG. 16 is a cross-sectional view along a one-dotted chain line of FIG. 14. The space between the cavity 1*c* and the ejection hole 1*d* is blocked by forming the partition plates 50 at a large thickness. The broken line and the one-dotted chain line in FIGS. 14 and 15 represent the same position.

Figure 17:
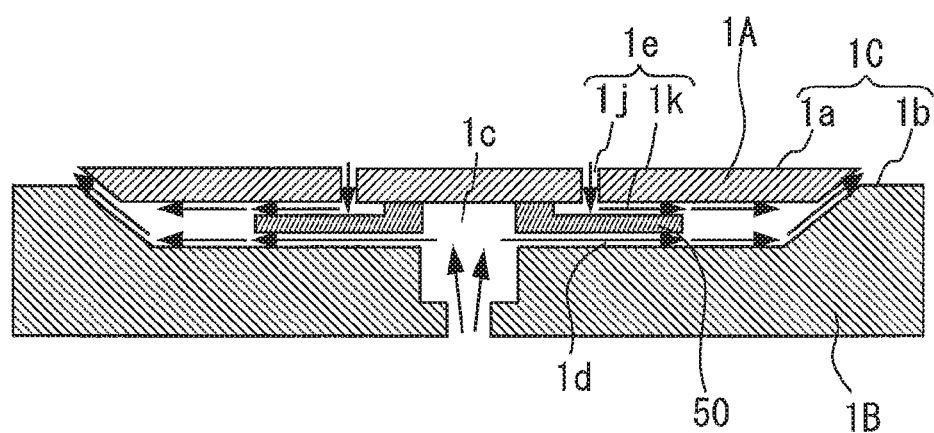
FIG. 17 is a diagram showing the gas flow.

FIG. 17 is a diagram showing that a gas flow inside the substrate support unit 1 according to the third embodiment is represented by arrows. The vacuum degree of the suction hole 1*e* can be enhanced by making the connection channel 1*j* intercommunicate with a portion on the cavity e side of the parallel channel 1*k*. By bringing the substrate into close contact with the substrate support unit 1, the substrate can be prevented from floating and breaking during rotation of the substrate.

Since the suction holes 1*e* according to the first embodiment are inclined in cross-sectional view, there is a risk that intrusion of gas traveling in the ejection hole 1*d* into the suction holes 1*e*, that is, "counter flow" occurs, so that the suction force of the substrate is destabilized. On the other hand, in the substrate suction stage according to the third embodiment of the present invention, there are portions where the parallel channels 1*k* and the ejection hole 1*d* extend in parallel, so that the intrusion of gas into the suction holes 1*e* can be prevented.

The effect of the present invention may be enhanced by appropriately combining the technical features of the respective embodiments described above.

Description of Symbols 1 substrate support unit, 1A first part, 1B second part, 1C top surface, 1*a* first top surface, 1*b* second top surface, 1*c* cavity, 1*d* ejection hole, 1*e* suction hole, 5 servo motor, 10 gas supply unit, 20 liquid treatment apparatus, 30 substrate

The invention claimed is:

1. A substrate suction stage comprising:
  a substrate support unit having a top surface, a cavity formed on a side opposite to the top surface, an ejection hole formed in the top surface that extends from the cavity to the top surface, and a suction hole that connects a midway part of the ejection hole and the top surface and is formed in and extends through the top surface at a point closer to a center of the top surface than where the ejection hole is formed in the top surface; and
  a gas supply unit configured to supply gas into the cavity, wherein the top surface of the substrate support unit has a first top surface having the suction hole formed therein, and a second top surface that surrounds the first top surface and is formed to be lower than the first top surface, and the ejection hole extending to a step portion between the first top surface and the second top surface.

2. The substrate suction stage according to claim 1, wherein the suction hole is formed to be inclined in cross-sectional view.

3. The substrate suction stage according to claim 1, wherein the substrate support unit is formed in a circular shape in plan view, and the ejection hole is formed to eject gas at an angle less than 90° with respect to a tangent of an outer edge of the substrate support unit.

4. The substrate suction stage according to claim 1, wherein the suction hole is formed by a parallel channel intercommunicating with the ejection hole and extending in parallel to the ejection hole, and a connection channel is provided for connecting the parallel channel and the top surface of the substrate support unit, the parallel channel has an area on a cavity side and an area on an outer edge side of the substrate support unit, the area on the outer edge side intercommunicates with the ejection hole, and the area on the cavity side intercommunicates with the connection channel.

5. The substrate suction stage according to claim 1, wherein
the suction hole is formed to be inclined in cross-sectional view.

6. The substrate suction stage according to claim 1, wherein
the suction hole is formed to be inclined in cross-sectional view, and
the substrate support unit is formed in a circular shape in plan view, and the ejection hole is formed to eject gas at an angle less than 90° with respect to a tangent of an outer edge of the substrate support unit.

7. The substrate suction stage according to claim 1, wherein
the substrate support unit is formed in a circular shape in plan view, and the ejection hole is formed to eject gas at an angle less than 90° with respect to a tangent of an outer edge of the substrate support unit.

8. The substrate suction stage according to claim 1, wherein
the suction hole is formed to be inclined in cross-sectional view, and
the suction hole is formed by a parallel channel intercommunicating with the ejection hole and extending in parallel to the ejection hole, and a connection channel is provided for connecting the parallel channel and the top surface of the substrate support unit, the parallel channel has an area on a cavity side and an area on an outer edge side of the substrate support unit, the area on the outer edge side intercommunicates with the ejection hole, and the area on the cavity side intercommunicates with the connection channel.

9. The substrate suction stage according to claim 1, wherein
the suction hole is formed by a parallel channel intercommunicating with the ejection hole and extending in parallel to the ejection hole, and a connection channel is provided for connecting the parallel channel and the top surface of the substrate support unit, the parallel channel has an area on a cavity side and an area on an outer edge side of the substrate support unit, the area on the outer edge side intercommunicates with the ejection hole, and the area on the cavity side intercommunicates with the connection channel.

10. The substrate suction stage according to claim 1, wherein
the substrate support unit is formed in a circular shape in plan view, and the ejection hole is formed to eject gas at an angle less than 90° with respect to a tangent of an outer edge of the substrate support unit, and
the suction hole is formed by a parallel channel intercommunicating with the ejection hole and extending in parallel to the ejection hole, and a connection channel is provided for connecting the parallel channel and the top surface of the substrate support unit, the parallel channel has an area on a cavity side and an area on an outer edge side of the substrate support unit, the area on the outer edge side intercommunicates with the ejection hole, and the area on the cavity side intercommunicates with the connection channel.

11. A substrate treatment apparatus comprising:
a substrate suction stage including a substrate support unit having a top surface, a cavity formed on a side opposite to the top surface, an ejection hole formed in the top surface that extends from the cavity to the top surface, and a suction hole that connects a midway part of the ejection hole and the top surface and is formed in and extends through the top surface at a point closer to a center of the top surface than where the ejection hole is formed in the top surface, and a gas supply unit configured to supply gas into the cavity; and
a liquid treatment apparatus for performing a liquid treatment on a substrate on the substrate suction stage,
wherein the top surface of the substrate support unit has a first top surface having the suction hole formed therein, and a second top surface that surrounds the first top surface and is formed to be lower than the first top surface, and the ejection hole extending to a step portion between the first top surface and the second top surface.

12. The substrate treatment apparatus according to claim 11, wherein the liquid treatment apparatus includes a liquid supply unit for supplying liquid to the substrate, and a laser unit for supplying a laser beam into the liquid.

13. A substrate treatment method comprising:
placing a substrate on a top surface of a substrate support unit; and
performing a liquid treatment on the substrate while, by supplying gas from one gas supply unit into a cavity inside the substrate support unit, the gas is sprayed from an ejection hole intercommunicating with the cavity to a peripheral portion of a back surface of the substrate, and gas is discharged from a suction hole for connecting the top surface of the substrate support unit and the ejection hole, thereby causing the substrate to be sucked on the substrate support unit.

14. The substrate treatment method according to claim 13, wherein the top surface of the substrate support unit is configured in a circular shape in plan view, and gas is ejected from the ejection hole at an angle less than 90° with respect to a tangent of an outer edge of the top surface of the substrate support unit, thereby spraying the gas to the whole peripheral portion of the back surface of the substrate.

15. The substrate treatment method according to claim 13, wherein the liquid treatment is a treatment for cutting the substrate with a laser beam while water is applied to a front surface of the substrate.

16. The substrate treatment method according to claim 13, wherein
the top surface of the substrate support unit is configured in a circular shape in plan view, and gas is ejected from the ejection hole at an angle less than 90° with respect to a tangent of an outer edge of the top surface of the substrate support unit, thereby spraying the gas to the whole peripheral portion of the back surface of the substrate, and
the liquid treatment is a treatment for cutting the substrate with a laser beam while water is applied to a front surface of the substrate.

* * * * *